US006498061B2

United States Patent
Divakaruni et al.

(10) Patent No.: US 6,498,061 B2
(45) Date of Patent: Dec. 24, 2002

(54) NEGATIVE ION IMPLANT MASK FORMATION FOR SELF-ALIGNED, SUBLITHOGRAPHIC RESOLUTION PATTERNING FOR SINGLE-SIDED VERTICAL DEVICE FORMATION

(75) Inventors: Rama Divakaruni, Somers, NY (US); Stephan Kudelka, Fishkill, NY (US); Helmut Tews, Poughkeepsie, NY (US); Irene McStay, Hopewell Junction, NY (US); Kil-Ho Lee, Wappingers Falls, NY (US); Uwe Schroeder, Klotzsche (DE)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 09/730,674

(22) Filed: Dec. 6, 2000

(65) Prior Publication Data

US 2002/0068399 A1 Jun. 6, 2002

(51) Int. Cl.$^7$ .......................................... H01L 21/8242
(52) U.S. Cl. ................... 438/243; 438/270; 438/272; 438/268; 257/301; 257/302; 257/304
(58) Field of Search .................. 438/243, 249, 438/270, 272, 268; 257/301, 302, 304, 242

(56) References Cited

U.S. PATENT DOCUMENTS

| | | | |
|---|---|---|---|
| 5,604,149 A | 2/1997 | Paoli et al. | 438/437 |
| 5,641,704 A | 6/1997 | Paoli et al. | 438/436 |
| 6,063,657 A | 5/2000 | Bronner | 438/244 |
| 6,066,527 A | 5/2000 | Kudelka et al. | 438/243 |
| 6,091,094 A * | 7/2000 | Rupp | 257/296 |
| 6,093,614 A | 7/2000 | Gruening et al. | 438/388 |
| 6,093,624 A * | 7/2000 | Gruening et al. | 438/388 |
| 6,339,241 B1 * | 1/2002 | Mandelman et al. | 257/301 |

* cited by examiner

Primary Examiner—Wael Fahmy
Assistant Examiner—Hsien Ming Lee
(74) Attorney, Agent, or Firm—H. Daniel Schnurmann; Graham S. Jones, II

(57) ABSTRACT

A process for fabricating a single-sided semiconductor deep trench structure filled with polysilicon trench fill material includes the following steps. Form a thin film, silicon nitride, barrier layer over the trench fill material. Deposit a thin film of an amorphous silicon masking layer over the barrier layer. Perform an angled implant into portions of the amorphous silicon masking layer which are not in the shadow of the deep trench. Strip the undoped portions of the amorphous silicon masking layer from the deep trench. Then strip the newly exposed portions of barrier layer exposing a part of the trench fill polysilicon surface and leaving the doped, remainder of the amorphous silicon masking layer exposed. Counterdope the exposed part of the trench fill material. Oxidize exposed portions of the polysilicon trench fill material, and then strip the remainder of the masking layer.

11 Claims, 5 Drawing Sheets

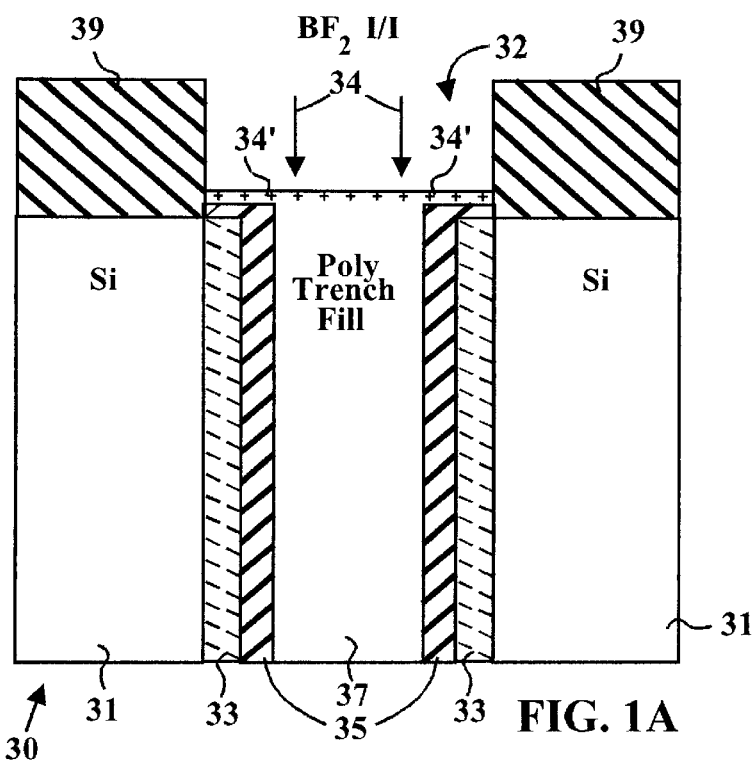
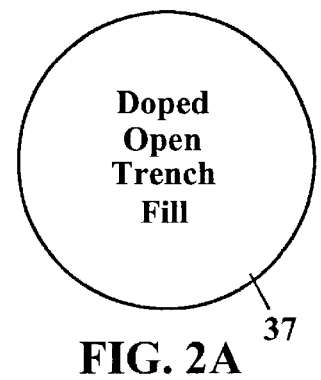
FIG. 1A
FIG. 2A
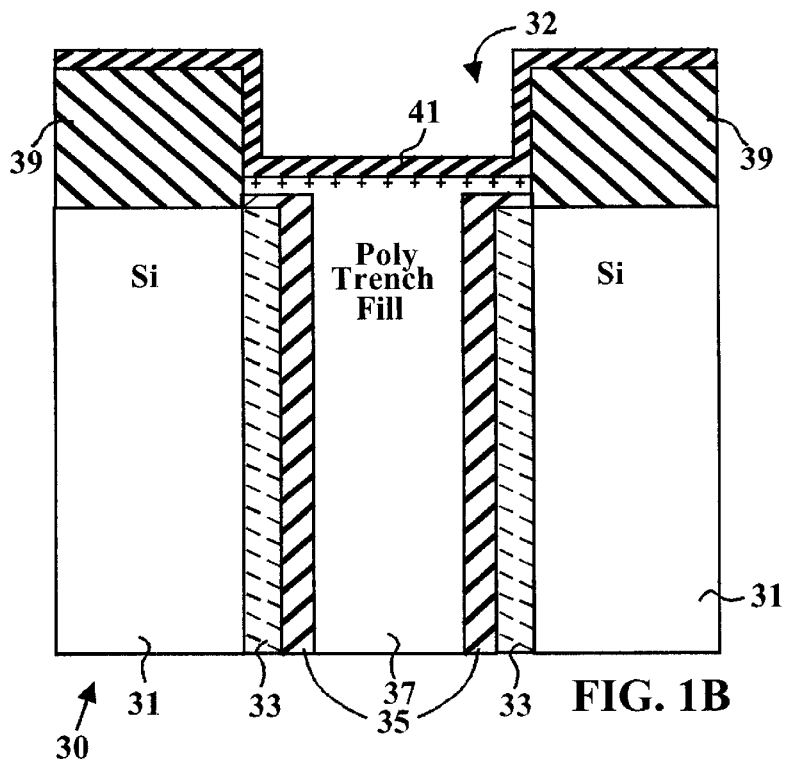
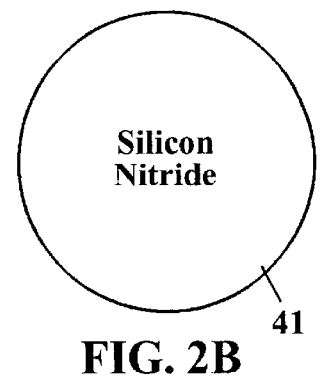
FIG. 1B
FIG. 2B

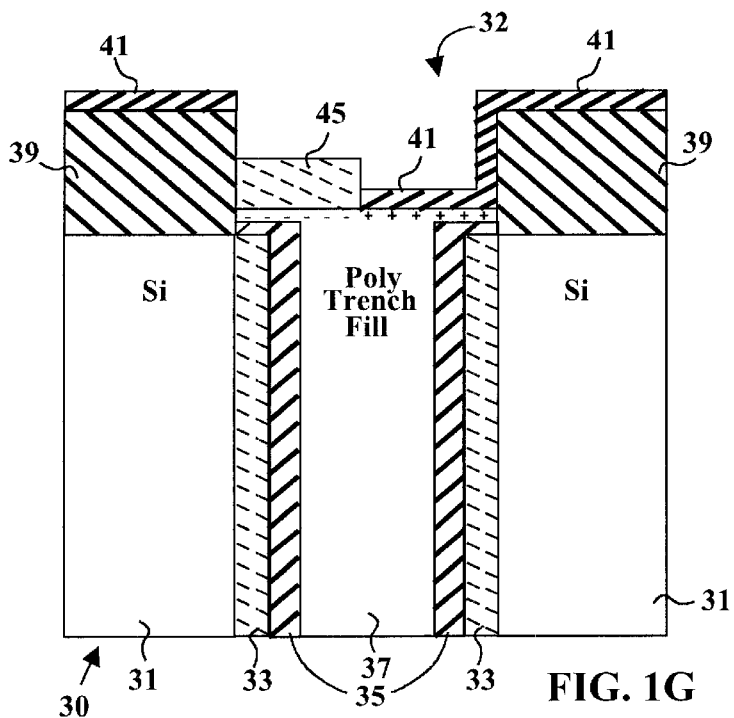
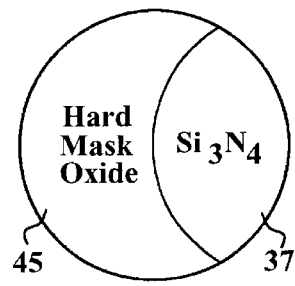
FIG. 1G
FIG. 2G
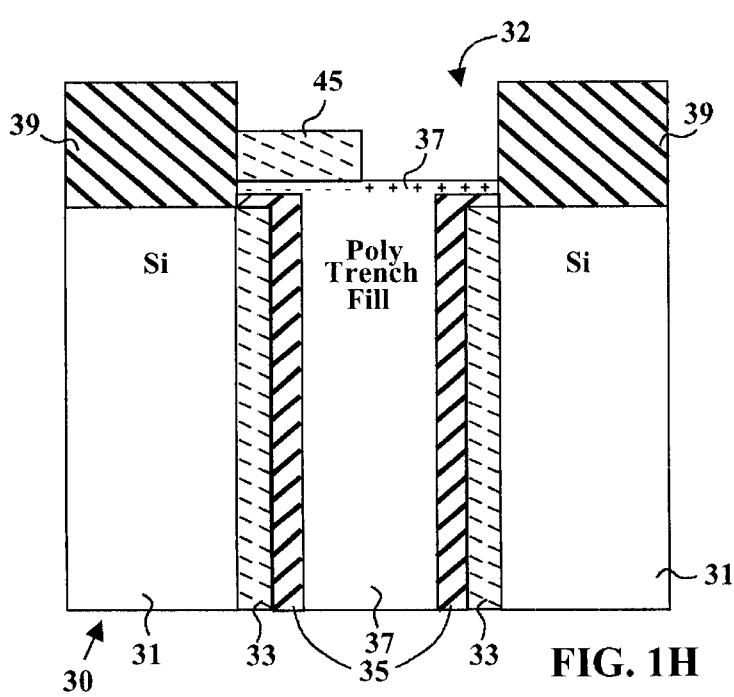
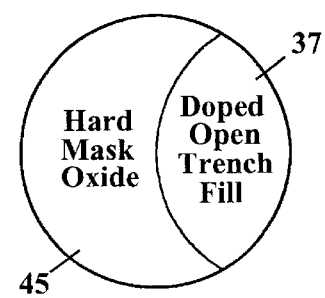
FIG. 1H
FIG. 2H

NEGATIVE ION IMPLANT MASK FORMATION FOR SELF-ALIGNED, SUBLITHOGRAPHIC RESOLUTION PATTERNING FOR SINGLE-SIDED VERTICAL DEVICE FORMATION

BACKGROUND OF THE INVENTION

1. Field of the Invention

This invention relates to semiconductor devices and more particularly to patterning and forming masks in deep trenches.

2. Description of Related Art

The formation of vertical devices within Deep Trench (DT) structures or any other trench structures for vertical devices often requires processing on one side of a deep trench. For example, this may involve the structuring of gate oxide, isolations or junctions on one side of the trench, whereas the other side of the trench remains unchanged.

The need for one-sided straps in deep trenches is outlined in copending, commonly assigned U.S. patent application (Docket No. FIS-99-0290-US1) Ser. No. 09/603,442, filed Jun. 23, 2000, of R. Divakaruni et al. for "Single Sided Buried Strap".

SUMMARY OF THE INVENTION

An object of this invention is to provide patterns with sublithographic resolution which overcome the overlay problems associated with aligning successive masks with overlay patterns which are slightly out of alignment.

Another object of this invention is to overcome a problem of a mask covering less than half of a full circle in a deep trench, which is detrimental taking into account mask undercutting during later process steps. invention provides a process flow that converts a positive silicon (Si) mask into a negative silicon dioxide ($SiO_2$) mask that can be used as a hard mask for silicon (Si) etching by RIE (Reactive Ion Etching). The invention overcomes overlay problems by employing self-aligned masks thereby providing a higher degree of accuracy than lithographic exposure tools which require independent alignment of successive masks.

This invention is particularly applicable for the formation of vertical devices within trench structures that require isolation on one side of the trench.

This invention describes a process flow for the formation of a positive oxide mask as a result of an angled ion implant (I/I) into silicon (Si) for the etching of polysilicon within the trench.

In accordance with this invention, a process is provided for fabricating a mask in a semiconductor deep trench structure filled with trench fill material. The steps comprise forming a barrier layer over the trench fill material; depositing a thin film masking layer over the barrier layer; performing an angled implant into the masking layer; stripping undoped portions of the masking layer from the deep trench; stripping exposed portions of barrier layer exposing a part of the trench fill polysilicon surface and leaving the remainder of the masking layer exposed; oxidizing exposed portions of trench fill material to form a self-aligned mask, and stripping the remainder of the masking layer, whereby overlay problems are avoided by forming a self-aligned mask. Preferably, the trench fill material comprises polysilicon, the barrier layer comprises a silicon nitride, and the masking layer comprises amorphous silicon. Preferably, the trench fill below the self-aligned mask is doped; and the self-aligned mask comprises an oxidized polysilicon hard mask.

Preferably, the trench fill below the self-aligned mask is doped, andthe self-aligned mask comprises an oxidized polysilicon hard mask. Preferably, the trench is lined with a conformal silicon dioxide layer followed by a conformal silicon nitride layer each having a top surface. The polysilicon trench fill material reaches over the top surfaces of the conformal silicon dioxide layer and the conformal silicon nitride layer.

In accordance with another aspect of this invention, a process for fabricating a mask in a semiconductor deep trench structure filled with trench fill material includes the following steps. Form a doped region in the surface of the trench fill material; form a barrier layer over the trench fill material; deposit an amorphous silicon thin film as a masking layer over the barrier layer; and perform an angled implant of a masking dopant into the amorphous silicon thin film. Then strip undoped portions of masking layer from the deep trench; strip exposed portions of barrier layer exposing a masking part of the trench fill polysilicon surface and leaving the remainder of the masking layer exposed. Counterdope the masking part of the trench fill material; oxidize exposed portions of trench fill material to form a self-aligned hard mask, and strip the remainder of the masking layer, whereby overlay problems are avoided by forming a self-aligned mask.

Preferably, the initial doping of the trench fill material is performed with P type dopant, the masking dopant for the masking layer comprises a P type dopant, the trench fill material comprises polysilicon, the barrier layer comprises silicon nitride, and the masking layer comprises amorphous silicon. Preferably, the counterdoping is an order of magnitude greater than the initial doping. Preferably, the masking dopant for the masking layer comprises a P type dopant, the trench fill material comprises polysilicon, the barrier layer comprises silicon nitride, and the masking layer comprises amorphous silicon.

In accordance with this invention, a self-aligned mask is formed on the surface of a semiconductor deep trench structure filled with trench fill material. As a result, overlay problems are avoided by forming the self-aligned mask. Preferably, the trench fill below the self-aligned mask is doped; the self-aligned mask comprises an oxidized polysilicon hard mask; and the self-aligned mask comprises an oxidized polysilicon hard mask.

In accordance with another aspect of this invention, a self-aligned mask is formed on a semiconductor deep trench structure which is filled with trench fill material. The self-aligned oxidized polysilicon hard mask is formed on the surface of the polysilicon trench fill material in the deep trench. As a result overlay problems are avoided by the alignment provided by the self-aligned mask.

Preferably, the trench fill below the hard mask is counterdoped with arsenic. Preferably, the trench fill is doped with a concentration of boron difluoride about an order of magnitude less than the concentration of arsenic therein. Preferably, the trench fill below the self-aligned mask is doped, and the self-aligned mask comprises an oxidized polysilicon hard mask, the trench fill below the hard mask is doped with arsenic; and trench fill is doped with a concentration of boron difluoride about an order of magnitude less than the concentration of arsenic therein.

BRIEF DESCRIPTION OF THE DRAWINGS

The foregoing and other aspects and advantages of this invention are explained and described below with reference to the accompanying drawings, in which:

FIGS. 1A–1H show a process flow for forming a deep trench mask in accordance with the method of this invention.

FIGS. 2A–2H show the structures visible on the surface of the trench at each stage of the process depicted by FIGS. 1A–1H.

DESCRIPTION OF THE PREFERRED EMBODIMENT

Figure 1C:
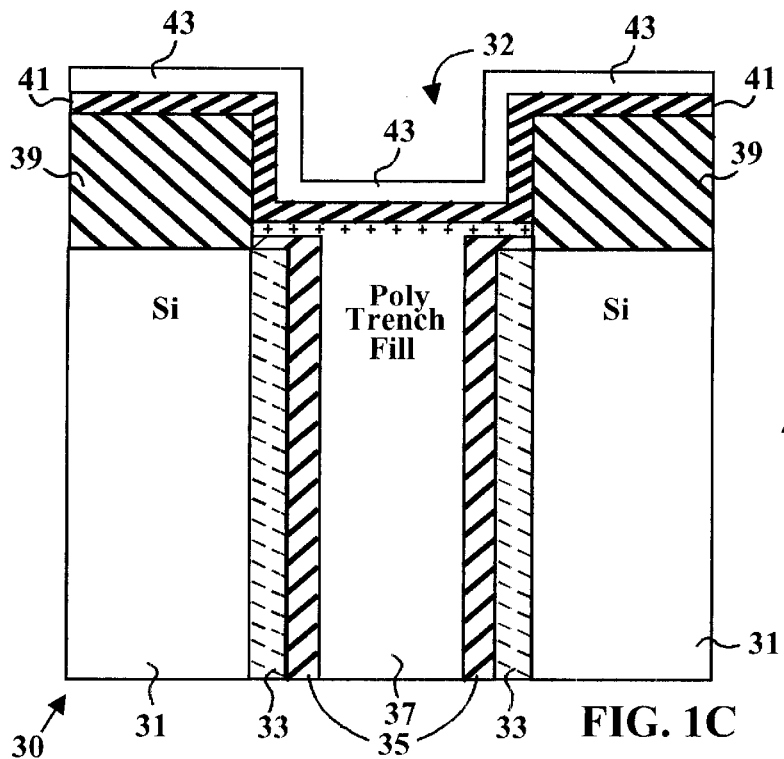
Figure 2C:
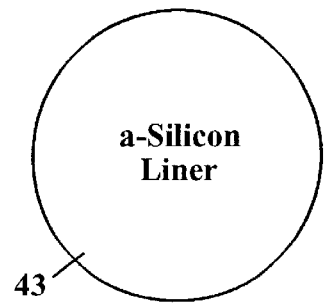

In order to create a sublithographic mask within a trench masked processes may be applied. However, due to overlay concerns, a self-aligned patterning technique such as angled ion implantation of P-type dopant into silicon (Si) layers is desirable to mask or to expose only one side of the trench.

One way to form a mask in a deep trench is to use the high etching selectivity for undoped silicon as contrasted to doped silicon in wet basic solutions. In addition, this invention uses the shadowing effect in recessed trench structures. That means a positive mask is formed. The mask is then transferred into silicon dioxide ($SiO_2$) and then used to etch the trench fill with an anisotropic RIE process. Due to the imaging of the circular structure, the mask is covering less than half of the full circle, which is detrimental taking into account mask undercutting during later process steps.

A method in accordance with this invention for sublithographic patterning of Si (silicon) within a trench structure uses an angled ion implantation of P-type dopant into the silicon, followed by a wet etch (e.g. $NH_4OH$, ammonium hydroxide) selective for the unimplanted areas.

Then the mask formed is transferred into the trench fill structure applying anisotropic RIE (Reactive Ion Etching). For applications involving circular trenches, the semicircular implant image can deliver a semicircular positive mask, that covers less than half of a full circle of a semicircular positive mask.

This invention, as described below, provides process steps employed to form a semicircular positive mask that covers more than half of a full circle.

Referring to FIG. 1A, a deep trench semiconductor structure 30 is shown formed in a bulk silicon substrate 31. A trench 32 has been formed in the substrate which has been lined with a thin conformal silicon dioxide layer 33, and a thin conformal silicon nitride layer 35 which reaches over on top of the silicon dioxide layer 33. Inside the layer 35, polysilicon trench filler material 37 has been formed to the top of the original trench, reaching over the silicon nitride layer 35. Around the sides of the trench 32 above the bulk silicon 31 is the pad silicon nitride layer 39.

FIG. 1A shows a deep trench 32 formed in a structure 30, in an early stage of the process of this invention. The deep trench 32 is formed in a bulk silicon substrate 31, which may be doped with dopant such as a P type dopant. The trench 32 is lined with a silicon dioxide 33 layer. A thin silicon nitride layer 35 is formed on the surface of the silicon dioxide layer 33.

The deep trench 37 is filled with intrinsic polysilicon 37 recessed below the surface of the pad silicon nitride layer 39. The recess depth depends on the trench Critical Dimension (CD) and the implant angle.

1) Shallow Ion Implant into Trench Fill

Figure 3:
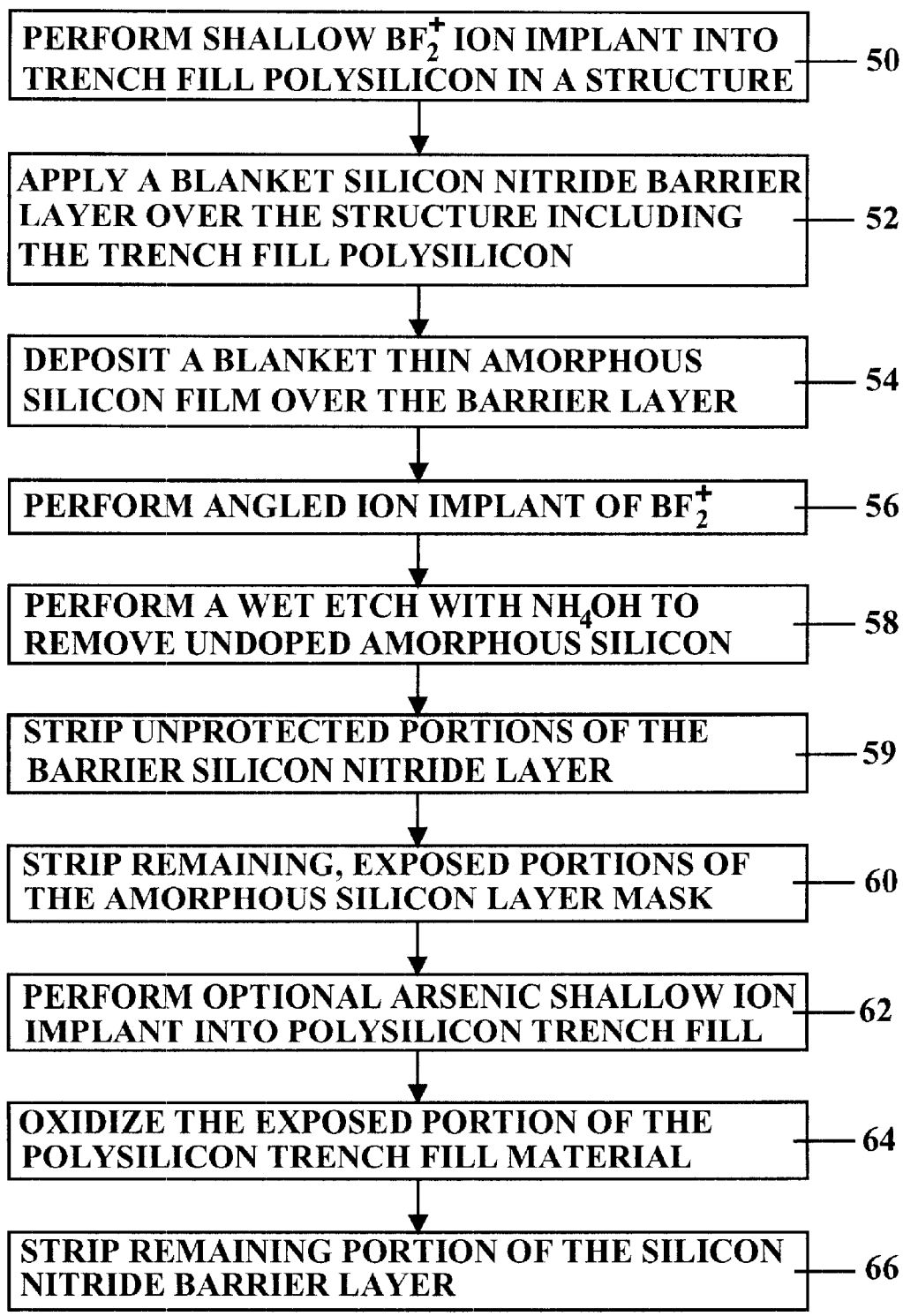
FIG. 3 shows the process flow chart for the method of this invention as depicted by FIGS. 1A–1H and 2A–2H.

FIG. 1A shows a structure 30, in accordance with this invention, during shallow ion implanting of a high dose of P-type dopant ions 34 (e.g. with a dose of about $BF_2$+2 keV/E14 ions/cm$^2$) which provide dopant 34' with a concentration of 1E19 atoms/cm$^3$ in the surface of polysilicon trench fill 37 in accordance with step 50 in FIG. 3.

2) Silicon Nitride Barrier Layer

FIG. 1B shows the structure 30 of FIG. 1A after deposition of a blanket thin film silicon nitride ($Si_3N_4$)barrier layer 41 by LPCVD covering the top surface of the polysilicon trench fill 37 and the pad layer 39. Barrier layer 41, which has a thickness of less than or equal to about 50 Angstroms (<=50 Å), covers all exposed surfaces of structure 30, especially including the top surface of the polysilicon trench fill 37, in accordance with step 52 in FIG. 3.

3) Amorphous Silicon Liner

FIG. 1C shows the structure 30 of FIG. 1B after deposition of a 100 Å thick amorphous silicon (a-Si) conformal liner layer 43 and the silicon nitride barrier layer 41 in accordance with step 54 in FIG. 3.

4) Angled Ion Implant

Figure 1D:
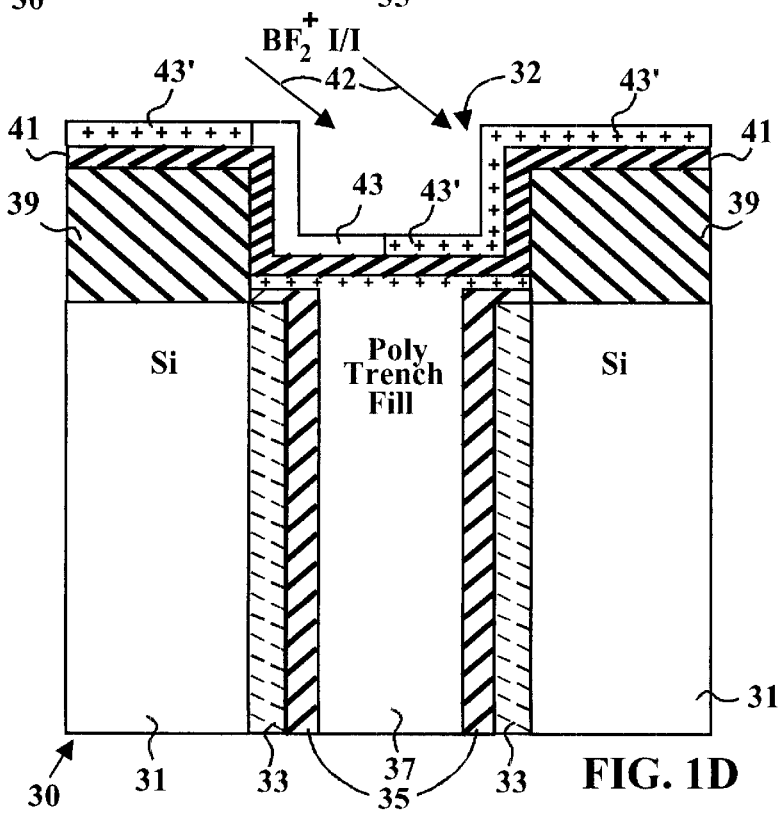

FIG. 1D shows the structure 30 of FIG. 1C during a shallow angled ion implant in accordance with step 56 in FIG. 3. of a dose of $BF_2$ P-dopant ions 42 (e.g. 45 degree tilt/10 keV/1E13 ions/cm$^2$) which produced doped amorphous silicon (a-Si) regions 43' (of amorphous silicon (a-Si) conformal liner layer 43). The doped amorphous silicon (a-Si) regions 43' have a dopant concentration of about 1E19 atoms/cm$^3$ in the doped amorphous silicon (a-Si) conformal liner layer 43' but the lower left region of the layer 43 on the left side of trench 32 is undoped where the shadow of the trench 32 has prevented the angle implant ions 42 from reaching the shadowed region of the amorphous silicon (a-Si) conformal liner layer 43.

5) Wet Etch of Undoped Amorphous Silicon

Figure 2D:
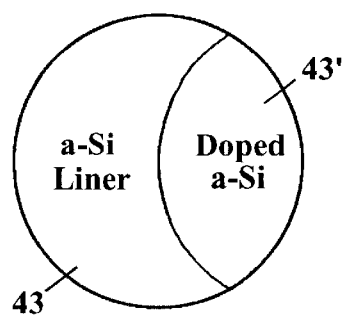
Figure 1E:
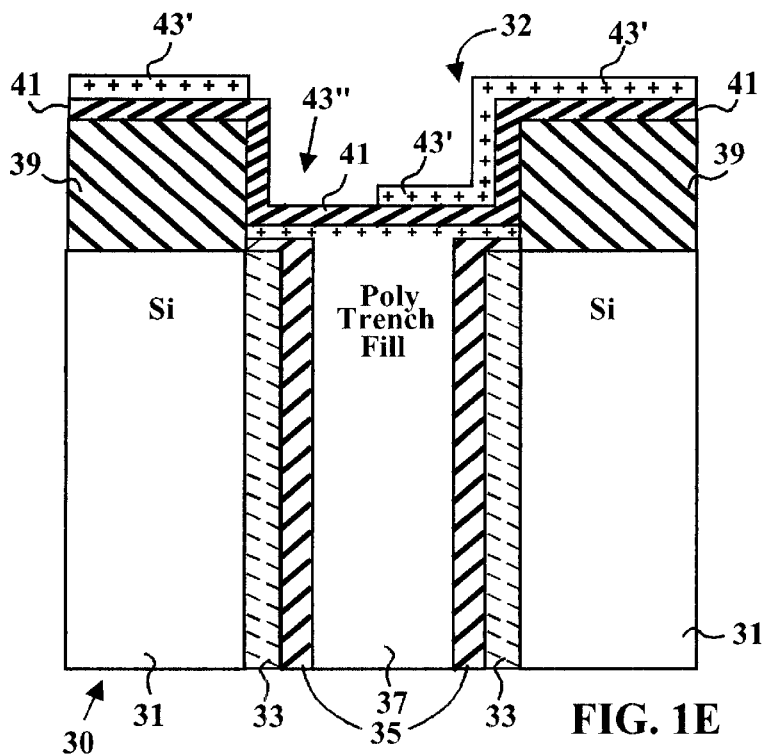
Figure 2E:
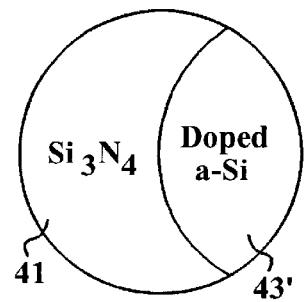

FIG. 1E shows the structure 30 of FIG. 1D after using a wet etch to remove the undoped shadowed region of the amorphous silicon liner layer 43 on the left side of FIGS. 1D and 2D in accordance with step 58 in FIG. 3. This forms a window 43" (opening) on the left side of the trench 32 which exposes a region of silicon nitride ($Si_3N_4$) barrier layer nitride layer 41. In step 58 in FIG. 3., the undoped amorphous silicon 43 has been removed to form a self-aligned mask with the window 43" (opening) therethrough (below the shadowed portion of layer 43) by using a wet etch of the undoped amorphous silicon 43 with ammonium hydroxide $NH_4OH$ leaving the doped amorphous silicon liner layer 43' in place on the right side in the trench 32 (and on the top surfaces above the pad nitride 39) exposing the silicon nitride ($Si_3N_4$) barrier layer 41 on the left.

6) Barrier Nitride Strip

Figure 1F:
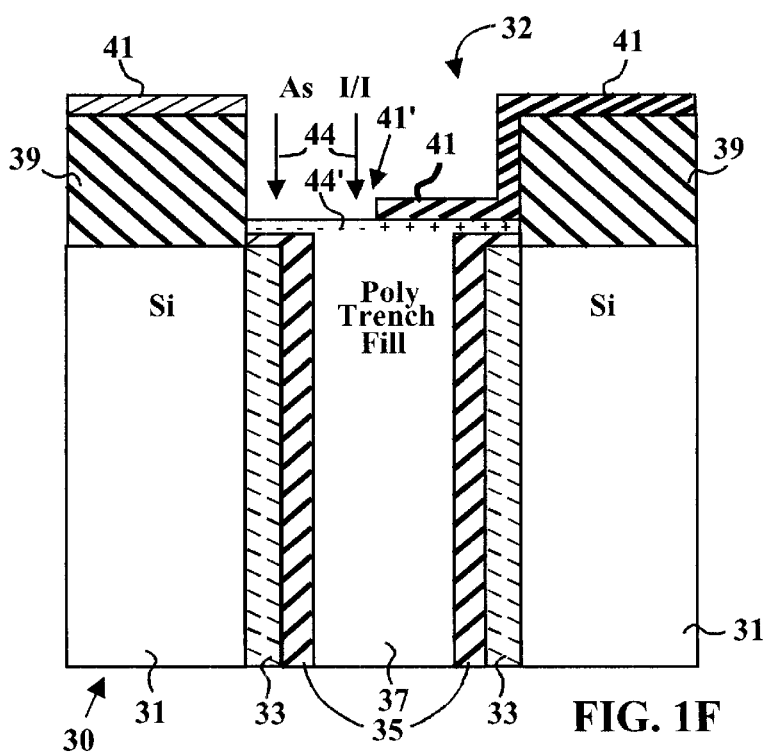
Figure 2F:
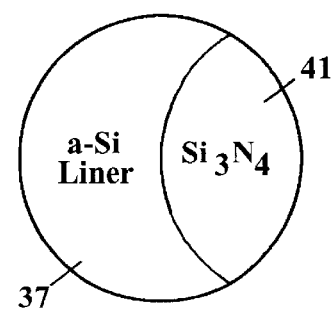

FIG. 1F shows the structure 30 of FIG. 1E after stripping the remaining, unprotected portion of the silicon liner 43' with an aqueous solution of an etchant preferably comprising an aqueous solution of hydrogen fluoride (HF)/Ethylene Glycol (EG) or other appropriate hot phosphoric acid ($H_3PO_4$) or an aqueous solution of hydrogen fluoride (HF)/Glycerol which selectively etches away the exposed portion of the silicon nitride layer 41 leaving the exposed silicon liner portion 43' on the right and the underlying portion of the silicon nitride barrier layer 41 on the right in accordance with step 59 in FIG. 3.

7) Strip Remaining, Doped Amorphous Silicon

Referring again to FIG. 1F, after stripping the unprotected portion of the barrier nitride layer 41 on the left producing a window 41' below the window 43", the remainder of the doped thin 100 Å amorphous silicon (a-Si) layer 43' is stripped with an aqueous solution of ammonium hydroxide NH4OH in a process which is selective in that it removes the amorphous silicon leaving the exposed portion of the highly doped p-implanted trench polysilicon 37 intact, in accordance with step 60 in FIG. 3.

8) Optional Shallow Implant into Trench Fill Polysilicon

Referring once again to FIG. 1F, perform an optional shallow ion implant of the trench polysilicon 37 with a high dose of arsenic ions 44 with a dose of about 1E15 ions/cm$^2$ producing a counterdoped region 44' in the surface of polysilicon trench fill 37 with a concentration of arsenic ions of about 1E20 atoms/cm$^3$ The counterdoping through window 43"s results in an increased oxidation rate in the following oxidation step 62 in FIG. 3 using the barrier silicon nitride (Si$_3$N$_4$) layer 41 as an implant mask, in accordance with step 62 in FIG. 3. This step can increase the local oxidation rate of the open trench silicon (SiO$_2$) in step 64 in FIG. 3. This prevents the development of oxidation under the silicon nitride (Si$_3$N$_4$) barrier layer 41. Note that the concentration of arsenic atoms implanted in step 62 into the trench polysilicon 37 is an order of magnitude larger than the concentration of boron atoms implanted into the trench polysilicon 37 in step 50.

9) Oxidation of Exposed Portion of Trench Fill Polysilicon

FIG. 1F shows the structure 30 of FIG. 1E after oxidation of the trench polysilicon 37 to form an oxidized polysilicon hard mask 45 in accordance with step 64 in FIG. 3.

10) Strip Remaining Barrier Nitride Layer Mask

Strip remaining portion of barrier nitride layer 41 with preferably comprising an aqueous solution of hydrogen fluoride (HF)/Ethylene Glycol (EG) or other appropriate known aqueous solutions such as hot phosphoric acid (H$_3$PO$_4$) or an aqueous solution of hydrogen fluoride (HF)/Glycerol HF/EG, in accordance with step 66 in FIG. 3.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. In a process for fabricating a mask in a semiconductor deep trench structure filled with trench fill material having a top surface, the steps comprising:

forming a barrier layer covering the top surface of the trench fill material, depositing a thin film masking layer over the barrier layer, performing an angled implant into the thin film masking layer, stripping undoped portions of the thin film masking layer from the deep trench leaving a window through the thin film masking layer leaving an exposed area of the barrier layer below the window, stripping the exposed area of the barrier layer which lies below the window through the thin film masking layer from the structure, thereby exposing a portion of the trench fill material surface and leaving the remainder of the barrier layer exposed, oxidizing the exposed portion of the trench fill material to form a self-aligned mask, and stripping the remainder of the barrier layer leaving the self-aligned mask whereby overlay problems are avoided by forming a self-aligned mask.

2. The process of claim 1 wherein:

the trench fill material comprises polysilicon, the barrier layer comprises silicon nitride, and the thin film masking layer comprises amorphous silicon.

3. The process of claim 1 wherein the trench fill material below the self-aligned mask is doped.

4. The process of claim 1 wherein: the self-aligned mask comprises an oxidized polysilicon hard mask.

5. The process of claim 1 wherein:

the trench fill material below the self-aligned mask is doped, and the self-aligned mask comprises an oxidized polysilicon hard mask.

6. A process in accordance with claim 1 wherein:

the trench is lined with a conformal silicon dioxide layer followed by a conformal silicon nitride layer each having a top surface, and the trench fill material reaches over the top surfaces of the conformal silicon dioxide layer and the conformal silicon nitride layer.

7. In a process for fabricating a mask in a semiconductor deep trench structure filled with trench fill material the steps comprising:

forming a doped region in the surface of the trench fill material, forming a barrier layer over the trench fill material, depositing an amorphous silicon thin film masking layer over the barrier layer, performing an angled implant of a masking dopant into the amorphous silicon thin film masking layer, stripping undoped portions of the amorphous silicon thin film masking layer from the deep trench, stripping exposed portions of barrier layer exposing a masking part of the trench fill polysilicon surface and leaving the remainder of the barrier layer exposed, counterdoping the masking part of the trench fill material, oxidizing exposed portions of the trench fill material to form a self-aligned hard mask, and stripping the remainder of the barrier layer, whereby overlay problems are avoided by forming a self-aligned mask.

8. The process of claim 7 wherein:

doping of the trench fill material is performed with P type dopant, the masking dopant for the masking layer comprises a P type dopant, the trench fill material comprises polysilicon, the barrier layer comprises silicon nitride, and the thin film masking layer comprises amorphous silicon.

9. The process of claim 7 wherein the counterdoping is an order of magnitude greater than doping.

10. The process of claim 7 wherein:

doping of the trench fill material is performed with P type dopant, the masking dopant for the masking layer comprises a P type dopant, the trench fill material comprises polysilicon, and the barrier layer comprises silicon nitride.

11. The process of claim 7 wherein:

the counterdoping is an order of magnitude greater than doping, and the thin film masking layer comprises amorphous silicon.

* * * * *